United States Patent
Chiou et al.

(10) Patent No.: US 10,096,722 B2
(45) Date of Patent: Oct. 9, 2018

(54) SEMICONDUCTOR DEVICE AND METHOD OF FORMING THE SAME

(71) Applicant: MACRONIX International Co., Ltd., Hsinchu (TW)

(72) Inventors: Chun-Ming Chiou, Hsinchu (TW); Cheng-Chi Lin, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/285,357

(22) Filed: Oct. 4, 2016

(65) Prior Publication Data

US 2018/0097124 A1    Apr. 5, 2018

(51) Int. Cl.
    *H01L 27/08*     (2006.01)
    *H01L 29/87*     (2006.01)
    *H01L 29/06*     (2006.01)
    *H01L 29/66*     (2006.01)

(52) U.S. Cl.
    CPC .......... *H01L 29/87* (2013.01); *H01L 29/0649* (2013.01); *H01L 29/66121* (2013.01)

(58) Field of Classification Search
CPC ............... H01L 27/027; H01L 27/0814; H01L 29/0623; H01L 29/6609
See application file for complete search history.

(56) References Cited

U.S. PATENT DOCUMENTS

| | | | |
|---|---|---|---|
| 2016/0043180 A1* | 2/2016 | Chang | H01L 29/0615 257/112 |
| 2016/0240657 A1* | 8/2016 | Chan | H01L 29/7816 |
| 2017/0025411 A1* | 1/2017 | Kumar | H01L 27/0727 |

* cited by examiner

*Primary Examiner* — Thomas L Dickey
(74) *Attorney, Agent, or Firm* — J.C. Patents (57) ABSTRACT

A semiconductor device having a fast recovery diode (FRD) is provided. The semiconductor device includes a substrate, a first well region disposed in the substrate, a base region disposed in the first well region, a first impurity region of a first conductivity type disposed in the base region, a second impurity region of a second conductivity type disposed in the first well region and separated from the base region, a first electrode electrically connected to the base region and the first impurity region, and a second electrode electrically connected to the second impurity region.

14 Claims, 7 Drawing Sheets

SEMICONDUCTOR DEVICE AND METHOD OF FORMING THE SAME

BACKGROUND OF THE INVENTION

Field of Invention

The present invention relates to a semiconductor device and a method of forming the same, and more generally to a semiconductor device having a fast recovery diode (FRD) and a method of forming the same.

Description of Related Art

A fast recovery diode is one of the most important elements of power electronics circuits. A fast recovery diode is required to exhibit short reverse recovery time (Trr), low operating power dissipation and high breakdown voltage. However, it is rather difficult to integrate a fast recovery diode with a CMOS device, and such on-chip fast recovery diode is usually formed with a low breakdown voltage due to the process limitation. Therefore, switching loss and even circuit failure are observed.

SUMMARY OF THE INVENTION

Accordingly, the present invention provides a semiconductor device and a method of forming the same, in which an on-chip fast recovery diode with short reverse recovery time and high breakdown voltage can be easily formed with the existing process.

The present invention provides a semiconductor device having a fast recovery diode. The semiconductor device includes a substrate, a first well region disposed in the substrate, a base region disposed in the first well region, a first impurity region of a first conductivity type disposed in the base region, a second impurity region of a second conductivity type disposed in the first well region and separated from the base region, a first electrode electrically connected to the base region and the first impurity region, and a second electrode electrically connected to the second impurity region.

According to an embodiment of the present invention, a doping concentration of the base region is between a doping concentration of the first well region and a doping concentration of the first impurity region.

According to an embodiment of the present invention, a sidewall and a bottom of the first impurity region are surrounded by the base region.

According to an embodiment of the present invention, each of the base region and the first impurity region has a ring shape surrounding the second impurity region.

According to an embodiment of the present invention, the base region and the first well region are of different conductivity types. The base region is of the first conductivity type, and the first well region is of the second conductivity type. Alternatively, the base region is of the second conductivity type, and the first well region is of the first conductivity type.

According to an embodiment of the present invention, the base region and the first well region are of the same conductivity type. The base region is of the first conductivity type, and the first well region is of the first conductivity type. Alternatively, the base region is of the second conductivity type, and the first well region is of the second conductivity type.

According to an embodiment of the present invention, the semiconductor device further includes a second well region and a barrier layer disposed in the substrate, wherein the second well region and the barrier layer enclose the first well region from around and below, respectively.

According to an embodiment of the present invention, the semiconductor device further includes a third impurity region disposed in the second well region, a third electrode electrically connected to the third impurity region, and an isolation region disposed between the third impurity region and the base region.

According to an embodiment of the present invention, a potential level of the third electrode is equal to or higher than a potential level of the second electrode.

According to an embodiment of the present invention, a conductivity type of the second well region, the barrier layer or the third impurity region is different from a conductivity type of the first well region.

The present invention further provides a method of forming a semiconductor device having a fast recovery diode, which includes forming a barrier layer in a substrate, forming a first well region in the substrate and above the barrier layer, forming a second well region in the substrate and surrounding the first well region, forming a base region in the first well region, and forming a first impurity region of a first conductivity type in the base region and forming a second impurity region of a second conductivity type in the first well region, wherein the second impurity region is separated from the base region.

According to an embodiment of the present invention, each of the base region and the first impurity region has a ring shape surrounding the second impurity region.

According to an embodiment of the present invention, the base region and the first well region are of different conductivity types.

According to an embodiment of the present invention, the base region and the first well region are of the same conductivity type.

According to an embodiment of the present invention, the method further includes forming a dielectric layer over the substrate, forming a first electrode through the dielectric layer and electrically connected to the base region and the first impurity region, and forming a second electrode through the dielectric layer and electrically connected to the second impurity region.

According to an embodiment of the present invention, the method further includes forming a third impurity region in the second well region, wherein the second electrode is electrically connected to the third impurity region.

In view of the above, the on-chip fast recovery diode of the invention can be easily fabricated with the existing process. Besides, the fast recovery diode of the invention can be formed with short reverse recovery time and high breakdown voltage, so the performance and reliability of the device can be thereby improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Herein, when a first conductivity type (or called first-type) is N-type, a second conductivity type (or called second-type) is P-type; or when a first conductivity type is P-type, a second conductivity type is N-type. In the following embodiments in which the first conductivity type is N-type and the second conductivity type is P-type are provided for illustration purposes, and are not construed as limiting the present invention. In an embodiment, the reference symbol "N+" indicates a high N-type doping concentration, and the reference symbol "N" indicates a medium or low N-type doping concentration. Similarly, the reference symbol "P+" indicates a high P-type doping concentration, and the reference symbol "P" indicates a medium or low P-type doping concentration. The N-type dopants include phosphorous or arsenic, and the P-type dopants include boron.

FIG. 1A to FIG. 1G are cross-sectional views of a method of forming a semiconductor device having a fast recovery diode (FRD) according to an embodiment of the present invention. FIG. 2 is a simplified top view of a semiconductor device having a fast recovery diode according to an embodiment of the present invention, in which some elements such as electrodes, isolation region, dielectric layer and barrier layer are omitted for simplicity and description convenience.

Figure 1A:
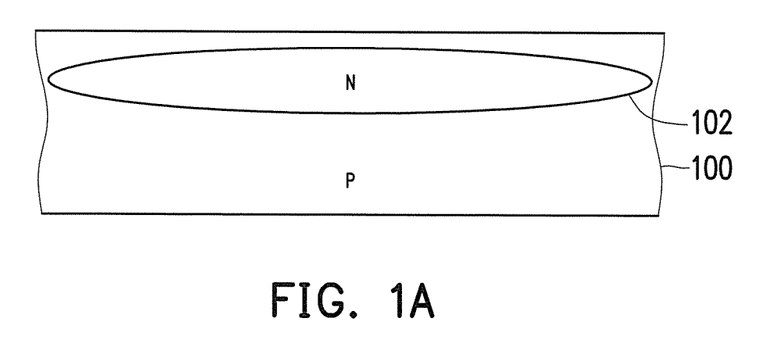
FIG. 1A to FIG. 1G are cross-sectional views of a method of forming a semiconductor device having a fast recovery diode according to an embodiment of the present invention.
Figure 1B:
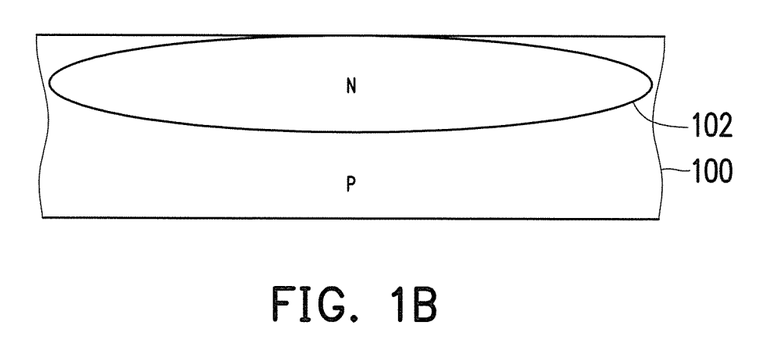
Figure 2:
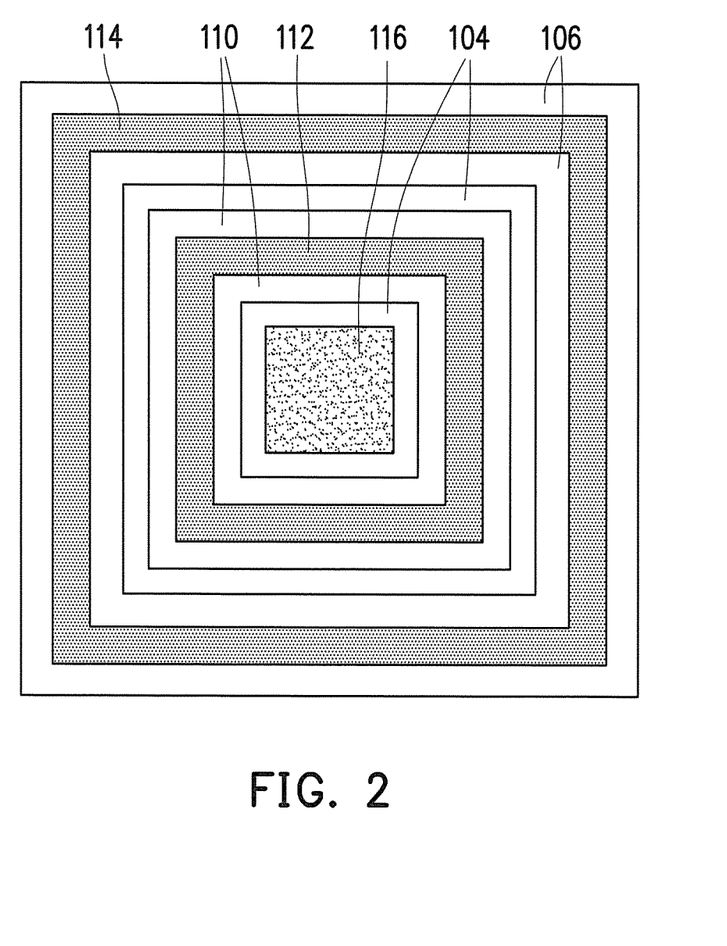
FIG. 2 is a simplified top view of a semiconductor device having a fast recovery diode according to an embodiment of the present invention.

Referring to FIG. 1A and FIG. 1B, a barrier layer 102 is formed in a substrate 100. The substrate 100 includes a semiconductor material, such as silicon. In an embodiment, the substrate 100 and the barrier layer 102 are of different conductivity types. In an embodiment, dopants of a first conductivity type (e.g., N-type) can be introduced into a substrate 100 of a second conductivity type (e.g., P-type) to form a barrier layer 102 of the first conductivity type. In an embodiment, the barrier layer 102 is selectively implanted in the substrate 100 in predetermined areas, for example, by a lithography process to expose the predetermined areas for the implantation to take place, as shown in FIG. 1A. The implanted barrier layer 102 is then expanded via the use of a high temperature diffusion process, as shown in FIG. 1B. In an embodiment, the barrier layer 102 has a doping concentration ranging from about 1E16 to 3E16 atom/cm$^3$, such as 2E16 atom/cm$^3$.

Figure 1C:
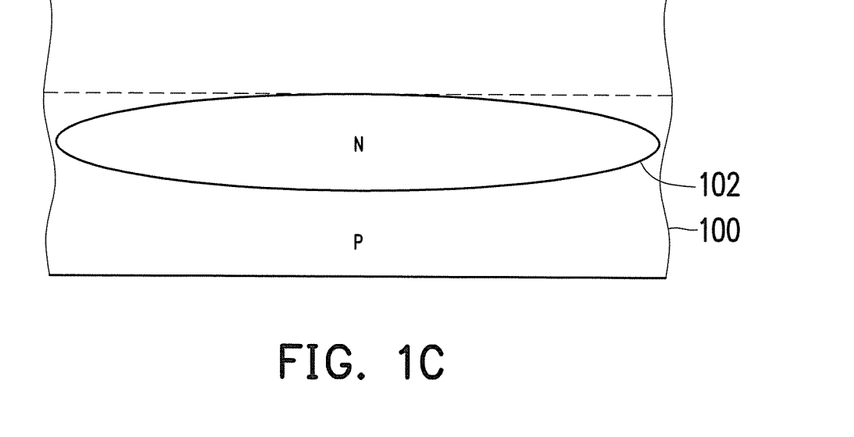

Referring to FIG. 1C, an epitaxial growth process is performed to the barrier layer 102 to form an epitaxy layer. In an embodiment, the epitaxy layer and the substrate 100 are of the same conductivity type. In an embodiment, the epitaxial growth process is of the second conductivity type (e.g., P-type) that is different from the first conductivity type (e.g., N-type) of the barrier layer 102. The epitaxy layer can act as a part of the substrate 100. In an embodiment, the barrier layer 102 can be implanted to a thick substrate 100 directly, without the step of forming the epitaxy layer.

Figure 1D:
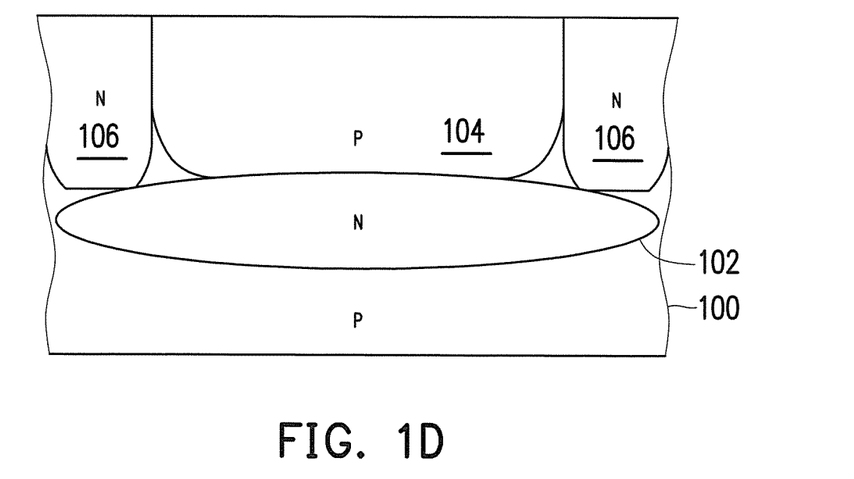

Referring to FIG. 1D, a first well region 104 and a second well region 106 are formed in the epitaxial layer of the substrate 100. In an embodiment, the first well region 104 and the second well region 106 are of different conductivity types. In an embodiment, dopants of the second conductivity type (e.g., P-type) can be introduced to form a first well region 104 of the second conductivity type in the epitaxy layer of the substrate 100 and above the barrier layer 102. The first well region 104 can be formed by an ion implantation followed by an annealing. Similarly, dopants of the first conductivity type (e.g., N-type) can be introduced to form a second well region 106 of the first conductivity type in the epitaxy layer of the substrate 100, and the second well region 106 is formed above the barrier layer 102 and surrounds the first well region 104. Specifically, the second well region 106 and the barrier layer 102 enclose the first well region 104 from around and below, respectively. That is, the bottom of the first well region 104 is in contact with the barrier layer 102, and the sidewall of the first well region 104 is in contact with the second well region 106. The second well region 106 can be formed by an ion implantation followed by an annealing. In an embodiment, the first well region 104 is formed prior to the formation of the second well region 106. In another embodiment, the first well region 104 is formed after the formation of the second well region 106. In an embodiment, the first well region 104 has a doping concentration ranging from about 1.5E16 to 2E16 atom/cm$^3$, and the second well region 106 has a doping concentration ranging from about 0.5E16 to 1.5E16 atom/cm$^3$.

In an embodiment, in the case that the first well region 104 and the substrate 100 have the same conductivity type, a portion of the substrate 100 can act as the first well region. That is, the step of forming the first well region 104 can be omitted as needed.

Figure 1E:
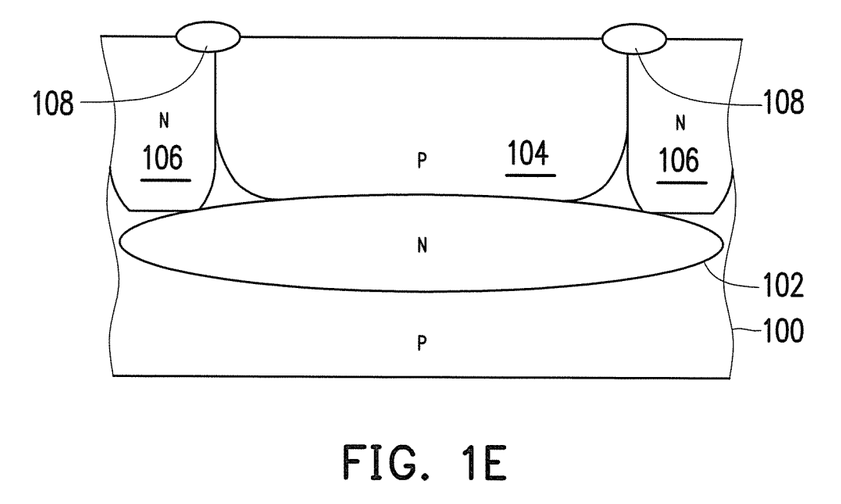

Referring to FIG. 1E, an isolation region 108 is formed between the first well region 104 and the second well region 106. Specifically, the isolation region 108 is partially overlapped with each of the first well region 104 and the second well region 106. In an embodiment, the isolation region 108 includes a doped or undoped silicon oxide, low-stress silicon nitride, silicon oxynitirde or a combination thereof. The isolation region 108 can be formed with a field oxide (FOX) process, a shallow trench isolation (STI) process or a deep trench isolation process.

Figure 1F:
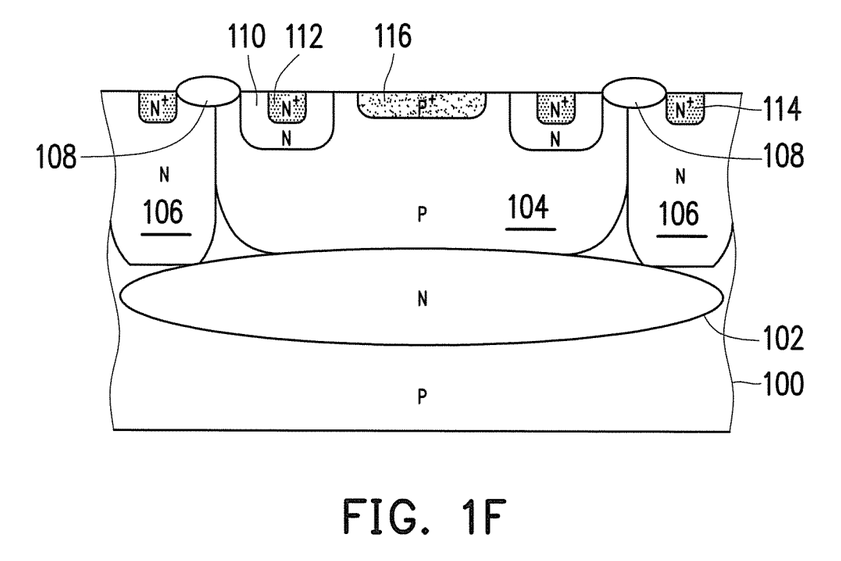

Referring to FIG. 1F, a base region 110 is formed in the first well region 104. In an embodiment, the base region 110 and the first well region 104 are of different conductivity types. In another embodiment, the base region 110 and the first well region 104 are of the same conductivity type. In either case, the doping concentration of the base region 110 is higher than the doping concentration of the first well region 104. In an embodiments, dopants of the first conductivity type (e.g., N-type) can be introduced to form a base region 110 of the first conductivity type in the first well region 104. The base region 110 can be formed by an ion implantation followed by an annealing. In an embodiment, the base region 110 has a doping concentration ranging from about 0.3E17 to 9E17 atom/cm$^3$ or 1E17 to 6E17 atom/cm$^3$.

Thereafter, a first impurity region 112 of the first conductivity type (e.g., N-type) is formed in the base region 110, and a second impurity region 116 of the second conductivity type (e.g., P-type) is formed in the first well region 104 and separated from the base region 110. In an embodiment, a third impurity region 114 can be simultaneously formed in the second well region 106 during the step of forming the first impurity region 112 or the second impurity region 116. Specifically, when the third impurity region 114 has a conductivity type the same as that of the first impurity region 112, the third impurity region 114 and the first impurity region 112 can be formed simultaneously. Alternatively, when the third impurity region 114 has a conductivity type the same as that of the second impurity region 116, the third impurity region 114 and the second impurity region 116 can be formed simultaneously. In an embodiment, the sidewall and the bottom of the first impurity region 112 are surrounded by the base region 110, the sidewall and the bottom of the second impurity region 116 are surrounded by the first well region 104, and the sidewall and the bottom of the third impurity region 114 are surrounded by the second well region 106. In an embodiment, the first impurity region 112 and the third impurity region 114 can be formed by an ion implantation followed by an annealing, and the second impurity region 116 can be formed by another ion implantation followed by another annealing. In an embodiment, the first impurity region 112 and the third impurity region 114 are formed prior to the formation of the second impurity region 116. In another embodiment, the first impurity region 112 and the third impurity region 114 are formed after the formation of the second impurity region 116.

In an embodiment, the doping concentration of the first impurity region 112 or the second impurity region 116 is higher than the doping concentration of the base region 110 or the first well region 104. In an embodiment, the doping concentration of the base region 110 is between the doping concentration of the first well region 104 and the doping concentration of the first impurity region 110. In an embodiment, the first impurity region 112 and the third impurity region 114 have a doping concentration ranging from about 1E18 to 1E20 atom/cm$^3$, and the second impurity region 116 has a doping concentration ranging from about 1E18 to 1E20 atom/cm$^3$.

Figure 1G:
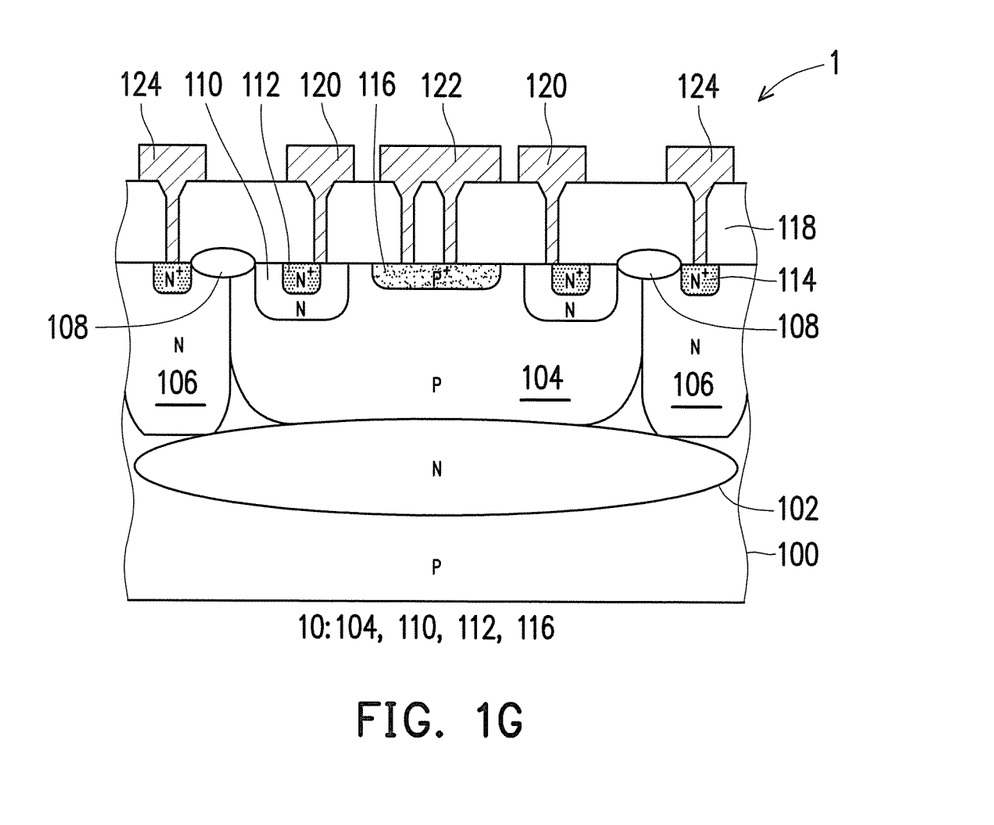

Referring to FIG. 1G, a dielectric layer 118 is formed over the various impurity regions with a deposition process. A metal plug is then formed for each of the impurity regions. In an embodiment, a first electrode 120 is formed through the dielectric layer 118 and electrically connected to the first impurity region 112, a second electrode 122 is formed through the dielectric layer 118 and electrically connected to the second impurity region 116, and a third electrode 124 is formed through the dielectric layer 118 and electrically connected to the third impurity region 114. In an embodiment, the first electrode 120 is further electrically connected to a portion of the base region 110 around the first impurity region 112. In an embodiment, the first electrode 120 can act as an anode, and the second electrode 122 can act as a cathode. In an embodiment, a metal route may be formed between the second electrode 122 for the second impurity region 116 and the third electrode 124 for the third impurity region 114. Specifically, the second electrode 122 is electrically connected to the third impurity region 114 via the third electrode 124 and the metal route. In such case, the second impurity region 116 and the third impurity region 114 are at an equal potential level. In another embodiment, the third impurity region 114 can be at a potential level higher than that of the second impurity region 116. A semiconductor device 1 including a fast recovery diode 10 is thus completed. In this embodiment, the P-type first well region 104, the N-type base region 110, the N-type first impurity region 112 and the P-type second impurity region 116 constitute the fast recovery diode 10 of the present invention. With the method of the invention, the on-chip fast recovery diode 10 can be formed with short reverse recovery time and high breakdown voltage, so the performance and reliability of the semiconductor device 1 can be thereby improved.

The semiconductor device of the present invention is illustrate below with reference to the cross-sectional views of FIG. 1G and FIGS. 3-5 and the top view of FIG. 2.

As shown in FIG. 1G and FIGS. 3-5, the semiconductor device 1/2/3/4 includes a substrate 100, a first well region 102, a base region 110, a first impurity region of a first conductivity type (e.g., N-type), a second impurity region of a second conductivity type (e.g., P-type), a first electrode 120 and a second electrode 122. The first well region 102 is disposed in the substrate 100. The base region 110 is disposed in the first well region 104. The first impurity region 112 is disposed in the base region 110. In an embodiment, the sidewall and the bottom of the first impurity region 112 are completely surrounded by the base region 110. The second impurity region 116 is disposed in the first well region 104 and separated from the base region 110. The first electrode 120 is electrically connected to the base region 110 and the first impurity region 112. The second electrode 122 is electrically connected to the second impurity region 116.

In an embodiment, the semiconductor device 1/2/3/4 further includes a barrier layer 102 and a second well region 106 disposed in the substrate 100. In an embodiment, the sidewall and the bottom of the first well region 104 are surrounded by the second well region 106 and the barrier layer 102 respectively.

It is noted that the second well region 106 and the barrier layer 102 have a conductivity type different from that of the first well region 104, and thus, the second well region 106 and the barrier layer 102 form a charge barrier to mitigate a leakage current from active regions of the first and second impurity regions 112 and 116 to an outer impurity region. Specifically, such charge barrier prevents leakage current and therefore device damage from occurring.

In an embodiment, the semiconductor device 1/2/3/4 further includes a third impurity region 114, a third electrode 124 and an isolation region 108. The third impurity region 114 is disposed in the second well region 106. The third electrode 124 is electrically connected to the third impurity region 114. The isolation region 108 is disposed between the third impurity region 114 and the base region 110. Specifically, the isolation region 108 is located between an outer boundary of the base region 110 and an inner boundary of the third impurity region 114.

In an embodiment, the potential level of the third electrode 124 is equal to the potential level of the second electrode 122. In another embodiment, the potential level of the third electrode 124 is higher than the potential level of the second electrode 122.

In an embodiment, the second impurity region 116 is in the shape of a block pattern (e.g., a polygon, rectangle, a square or a circle), and each of the base region 110 and the first impurity region 112 is in the shape of a ring pattern (e.g., a polygon ring, a rectangular ring, a square ring or a circle ring) and configured to surround the second impurity region 116. Such layout can reduce the contact area between the base region 110 and the first well region 104, so the junction capacitance between the first and second electrodes 120 and 122 can be reduced, and the reverse recovery time can be accordingly decreased.

Besides, the first electrode 120 is electrically connected to the base region 110 and the first impurity region 112, so as to robust the reliability of the device. In an embodiment, with such design, the device can survive over one week in a high temperature (e.g., 150° C.) lamp ON/OFF test.

In addition, the doping concentration of the base region 110 is between the doping concentration of the first well region 104 and the doping concentration of the first impurity region 110, and the base region 110 is separated from the second impurity region 116. In an embodiment, with such design, the breakdown voltage of the device can be greatly improved.

The semiconductor device 1/2/3/4 has a fast recovery diode 10 formed therein. As shown in the fast recovery diode 10 of FIG. 1G, the N-type first impurity region 112 is within the N-type base region 110, and the P-type second impurity region 116 is within the P-type first well region 104 and separated from the N-type base region 110. As shown in the fast recovery diode 10 of FIG. 3, the N-type first impurity region 112 is within the P-type base region 110, and the P-type second impurity region 116 is within the N-type first well region 104 and separated from the P-type base region 110.

Figure 3:
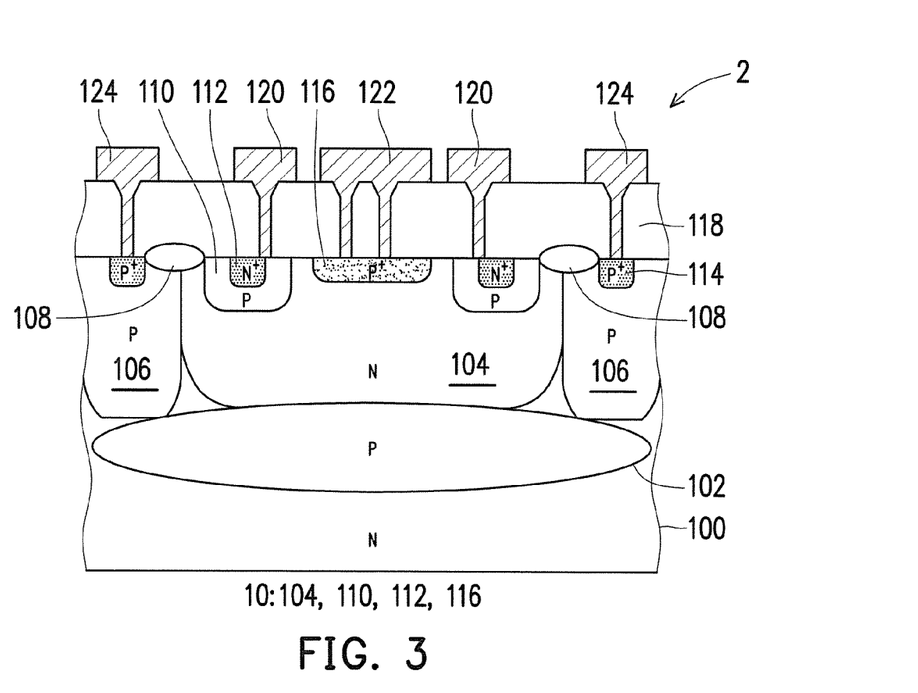
FIG. 3 is a cross-sectional view of a semiconductor device having a fast recovery diode according to another embodiment of the present invention.

The embodiments of FIG. 1G and FIG. 3 in which the base region 110 and the first well region 104 are of different conductivity types are provided for illustration purposes, and are not construed as limited the present invention. In other embodiments, the base region 110 and the first well region 104 can be of the same conductivity type, as shown in FIG. 4 and FIG. 5.

Figure 4:
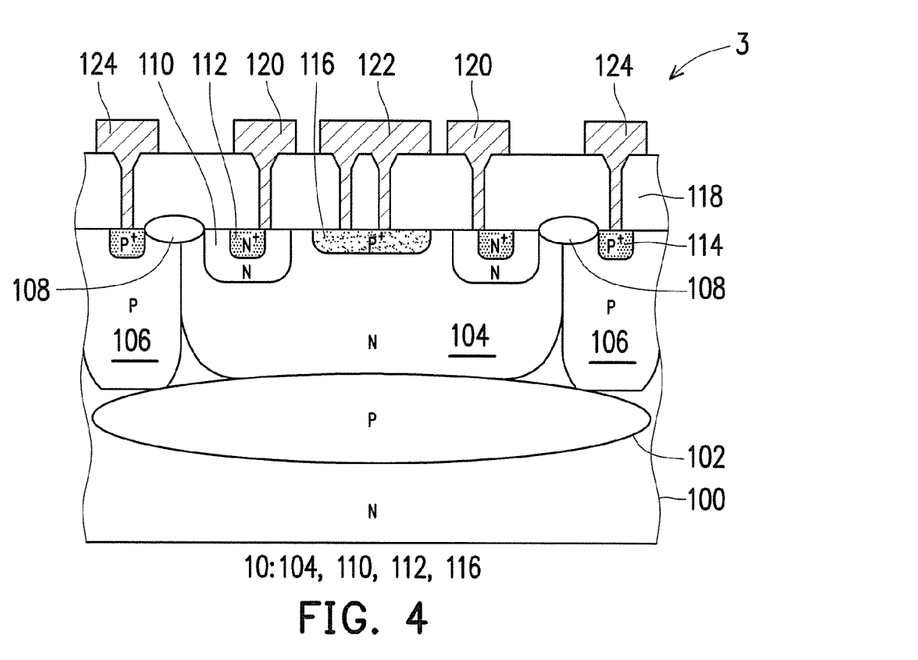
FIG. 4 is a cross-sectional view of a semiconductor device having a fast recovery diode according to yet another embodiment of the present invention.

As show in the fast recovery diode 10 of FIG. 4, the N-type first impurity region 112 is within the N-type base region 110, and the P-type second impurity region 116 is within the N-type first well region 104 and separated from the N-type base region 110. As shown in the fast recovery diode 10 of FIG. 5, the N-type first impurity region 112 is within the P-type base region 110, and the P-type second impurity region 116 is within the P-type first well region 104 and separated from the P-type base region 110.

Figure 5:
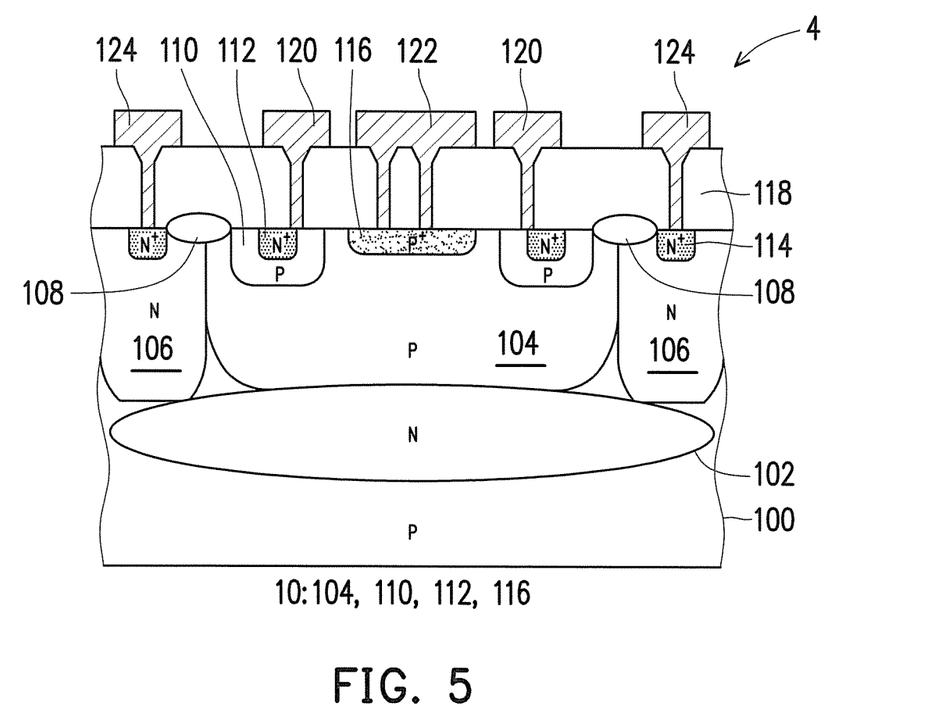
FIG. 5 is a cross-sectional view of a semiconductor device having a fast recovery diode according to still another embodiment of the present invention.

In some embodiments, the fast recovery diodes 10 of FIG. 1G and FIG. 3 can provide a higher breakdown voltage than those of FIG. 4 and FIG. 5.

In summary, in the present invention, by disposing a base region around a first-type impurity region, separating a second-type impurity region from the base region and controlling the doping concentrations thereof, an on-chip fast recovery diode can be formed with a short reverse recovery time (e.g., less than about 10 ns) and a high breakdown voltage (e.g., greater than about 20 volts). When N fast recovery diodes of the invention are in series connection, the total reverse recovery time (e.g., less than about 10 ns) is still short while the total breakdown voltage (e.g., greater than 20 N volts) is greatly increased.

Since the fast recovery diode of the invention has advantages of high breakdown voltage, fast reverse recovery time and excellent reliability, it can be applied to the power electronics circuit such as lighting (such as compact fluorescent lamp circuit), power supplies, uninterruptible power supply (UPS) units and motor drives.

Besides, the examples of the semiconductor device including a fast recovery diode as illustrated in the invention can be used in a voltage regulator, voltage shifter or waveform clipper, transient voltage suppressor (TVS), or any other circuit that uses a fast recovery diode.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device having a fast recovery diode (FRD), the semiconductor device comprising:
   a substrate;
   a first well region, disposed in the substrate;
   a base region, disposed in the first well region;
   a first impurity region of a first conductivity type, disposed in the base region;
   a second impurity region of a second conductivity type, disposed in the first well region and separated from the base region,
   a first electrode, physically connected to the base region and the first impurity region; and
   a second electrode, electrically connected to the second impurity region,
   wherein the base region and the first well region are of the same conductivity type.

2. The semiconductor device of claim 1, wherein a doping concentration of the base region is between a doping concentration of the first well region and a doping concentration of the first impurity region.

3. The semiconductor device of claim 1, wherein a sidewall and a bottom of the first impurity region are surrounded by the base region.

4. The semiconductor device of claim 1, wherein each of the base region and the first impurity region has a ring shape surrounding the second impurity region.

5. The semiconductor device of claim 1, wherein the base region is of the first conductivity type, and the first well region is of the first conductivity type.

6. The semiconductor device of claim 1, wherein the base region is of the second conductivity type, and the first well region is of the second conductivity type.

7. The semiconductor device of claim 1, further comprising a second well region and a barrier layer disposed in the substrate, wherein the second well region and the barrier layer enclose the first well region from around and below, respectively.

8. The semiconductor device of claim 7, further comprising:
   a third impurity region, disposed in the second well region;
   a third electrode, electrically connected to the third impurity region; and
   an isolation region, disposed between the third impurity region and the base region.

9. The semiconductor device of claim 8, wherein a potential level of the third electrode is equal to or higher than a potential level of the second electrode.

10. The semiconductor device of claim 7, wherein a conductivity type of the second well region, the barrier layer or the third impurity region is different from a conductivity type of the first well region.

11. A method of forming a semiconductor device having a fast recovery diode (FRD), comprising:
    forming a barrier layer in a substrate;
    forming a first well region in the substrate and above the barrier layer;

forming a second well region in the substrate and surrounding the first well region;

forming a base region in the first well region;

forming a first impurity region of a first conductivity type in the base region and forming a second impurity region of a second conductivity type in the first well region;

forming a dielectric layer over the substrate; and forming a first electrode through the dielectric layer and physically connected to the base region and the first impurity region, wherein the second impurity region is separated from the base region, and wherein the base region and the first well region are of the same conductivity type.

12. The method of claim 11, wherein each of the base region and the first impurity region has a ring shape surrounding the second impurity region.

13. The method of claim 11, further comprising:

forming a second electrode through the dielectric layer and electrically connected to the second impurity region.

14. The method of claim 11, further comprising:

forming a third impurity region in the second well region, wherein the second electrode is electrically connected to the third impurity region.

* * * * *